United States Patent
Liou et al.

(10) Patent No.: US 9,543,509 B2
(45) Date of Patent: Jan. 10, 2017

(54) MAGNATORESISTIVE STRUCTURE AND METHOD FOR FORMING THE SAME

(71) Applicant: Voltafield Technology Corp., Zhubei, Hsinchu County (TW)

(72) Inventors: Fu-Tai Liou, Zhubei (TW); Chien-Min Lee, Hsinchu County (TW); Nai-Chung Fu, Zhubei (TW)

(73) Assignee: Voltafield Technology Corp., Zhubei (TW)

( * ) Notice: Subject to any disclaimer, the term of this patent is extended or adjusted under 35 U.S.C. 154(b) by 0 days.

(21) Appl. No.: 14/059,561

(22) Filed: Oct. 22, 2013

(65) Prior Publication Data
US 2014/0332914 A1    Nov. 13, 2014

(30) Foreign Application Priority Data
May 10, 2013   (TW) .............................. 102116605 A (51) Int. Cl.
*H01L 43/12*   (2006.01)
*G01R 33/09*   (2006.01)
*H01L 43/08*   (2006.01)

(52) U.S. Cl.
CPC ............. *H01L 43/12* (2013.01); *G01R 33/093* (2013.01); *H01L 43/08* (2013.01)

(58) Field of Classification Search
CPC .............................. G01R 33/093; H01L 43/12
See application file for complete search history.

(56) References Cited

U.S. PATENT DOCUMENTS

| | | | |
|---|---|---|---|
| 2003/0150835 A1* | 8/2003 | Ju | B82Y 10/00 216/22 |
| 2004/0042261 A1* | 3/2004 | Tuttle | 365/158 |
| 2010/0247966 A1* | 9/2010 | Zhao et al. | 428/811.1 |
| 2011/0194341 A1* | 8/2011 | Gaidis et al. | 365/171 |
| 2013/0032908 A1* | 2/2013 | Tang et al. | 257/421 |

* cited by examiner

*Primary Examiner* — Thao X Le
*Assistant Examiner* — Xia L Cross
(74) *Attorney, Agent, or Firm* — Alan D. Kamrath; Kamrath IP Lawfirm, P.A.

(57) ABSTRACT

A magnetoresistive structure includes a substrate and a patterned stack structure. The substrate has a back surface and a front surface having a step portion. The patterned stack structure is on the step portion of the front surface and comprises a magnetoresistive layer, a conductive cap layer and a dielectric hard mask layer. The step portion has a top surface parallel to the back surface, a bottom surface parallel to the back surface and a step height joining the top surface and bottom surface and being not parallel to the back surface.

9 Claims, 9 Drawing Sheets

MAGNATORESISTIVE STRUCTURE AND METHOD FOR FORMING THE SAME

FIELD OF THE INVENTION

The present invention is related to a magnetoresistive structure, especially to a magnetoresistive structure on a step portion.

BACKGROUND OF THE INVENTION

Generally, photolithography then etching is a well-known procedure in semiconductor process for forming fine patterns. Photoresist materials used in photolithography process should act as etching masks to protect the patterned material underneath from attack by etchants. However, in some cases where materials to be etched are too thick or having poor etching selectivity with respect to photoresist, unexpected defects or flaws may appear during the etching process and make it difficult to achieve expected pattern profiles.

SUMMARY OF THE INVENTION

The objective of the present invention is to provide a magnetoresistive structure with a stack structure having a dielectric hard mask layer to ensure structural integrity and flawlessness.

A magnetoresistive structure including a substrate and a patterned stack structure is provided. The substrate has a back surface and a front surface having a step portion. The patterned stack structure is on the step portion of the front surface and comprises a magnetoresistive layer, a conductive cap layer and a dielectric hard mask layer. The step portion has a top surface parallel to the back surface, a bottom surface parallel to the back surface and a step height joining the top surface and bottom surface and being not parallel to the back surface.

A method for forming a magnetoresistive structure is provided. This method comprises: providing a substrate with a back surface and a front surface having a step portion; blanketly forming a stacked structure on the front surface of the substrate, the stacked structure having a magnetoresistive layer, a conductive cap layer and a dielectric hard mask layer; patterning the dielectric hard mask layer to form an patterned dielectric hard mask layer; and patterning the conductive cap layer and the magnetoresistive layer using the patterned dielectric hard mask layer as a mask.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 1 and 3A-3C illustrates the second embodiment of a method for forming a magnetoresistive structure;

DETAILED DESCRIPTION OF PREFERRED EMBODIMENTS

The present invention focuses on a magnetoresistive structure, especially a magnetoresistive structure with a step portion. This magnetoresistive structure may be a part of a magnetoresistive sensing device or magnetic memory device and/or it may further comprise other commonly used structures or elements such as built in test circuit, set/reset circuit, compensation circuit, various circuitry comprising amplifiers, filters, converters, shields, interconnect, etc. To clearly illustrate this invention and not to obscure its focus, the descriptions of these commonly used structures or elements are omitted, but it does not mean the magnetoresistive structure of the present invention can not optionally comprise these structures or elements.

The following is the detailed description of the preferred embodiments of this invention. All the elements, sub-elements, structures, materials, arrangements recited herein can be combined in any way and in any order into new embodiments, and these new embodiments should fall in the scope of this invention defined by the appended claims. A person skilled in the art, upon reading this invention, should be able to modify and change the elements, sub-elements, structures, materials, arrangements recited herein without being apart from the principle and spirit of this invention. Therefore, these modifications and changes should fall in the scope of this invention defined only by the following claims.

There are a lot of embodiments and figures in this application. To avoid confusions, similar components are represented by same or similar numerals. To avoid complexity and confusions, only one of the repetitive components is marked. Figures are meant to deliver the principle and spirits of this invention, so the distance, size, ratio, shape, connection relationship, etc. are examples instead of realities. Other distance, size, ratio, shape, connection relationship, etc. capable of achieving the same functions or results can be adopted as equivalents.

Figure 1:
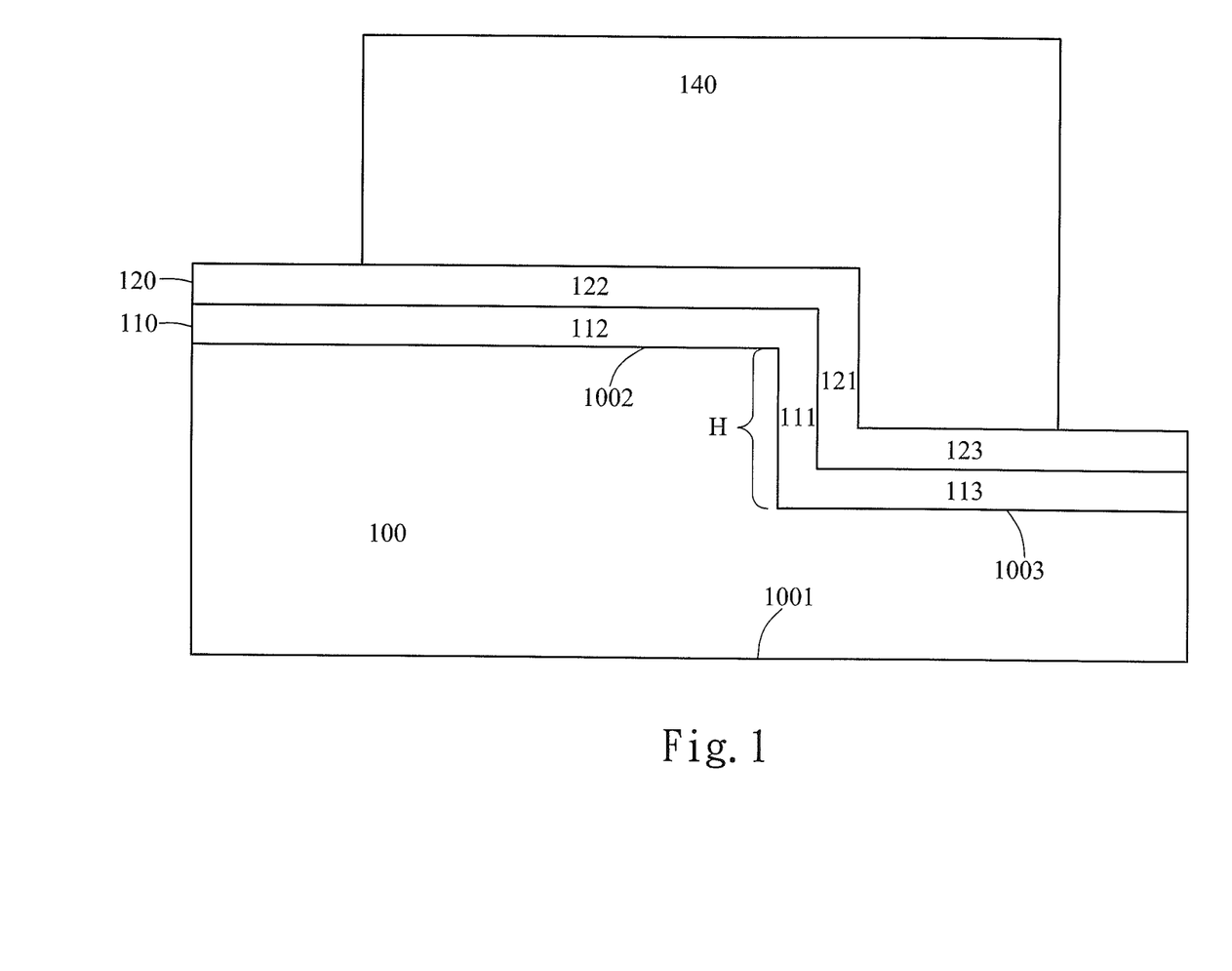
FIGS. 1 and 2A-2B illustrates the first embodiment of a method for forming a magnetoresistive structure.
Figure 2A:
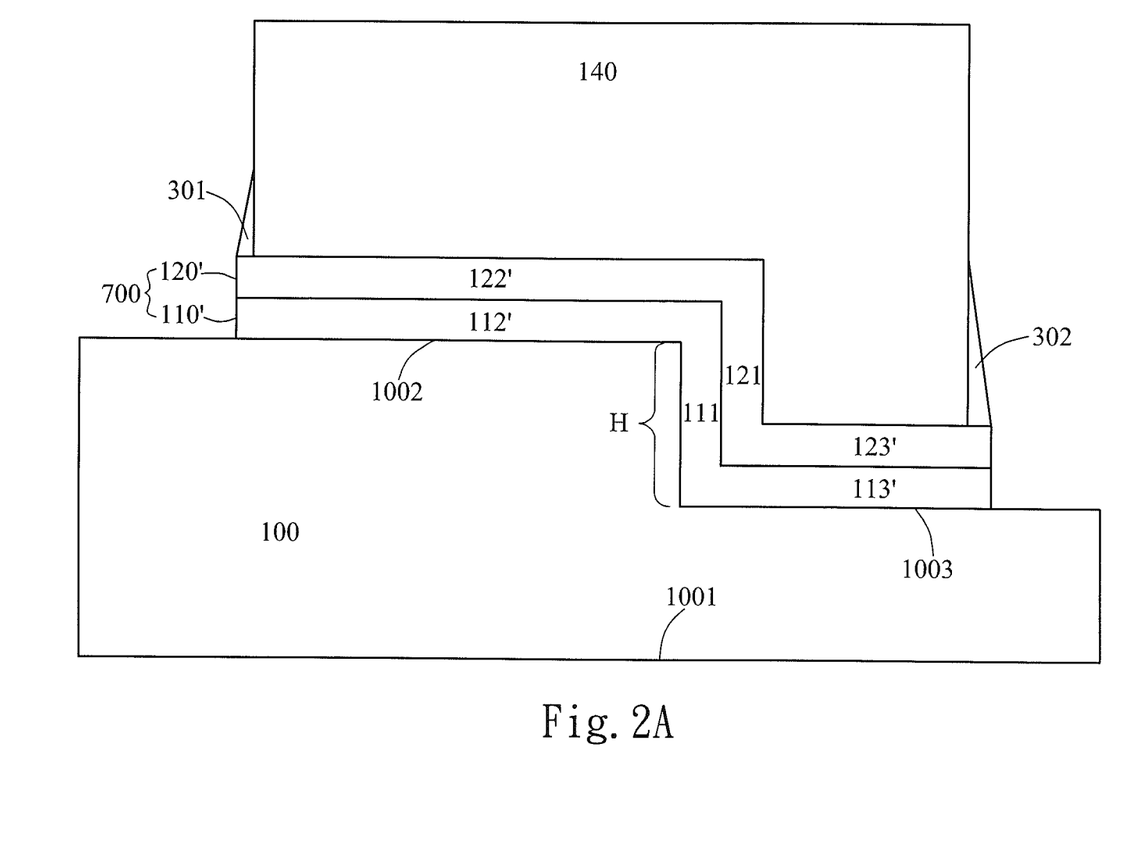
Figure 2B:
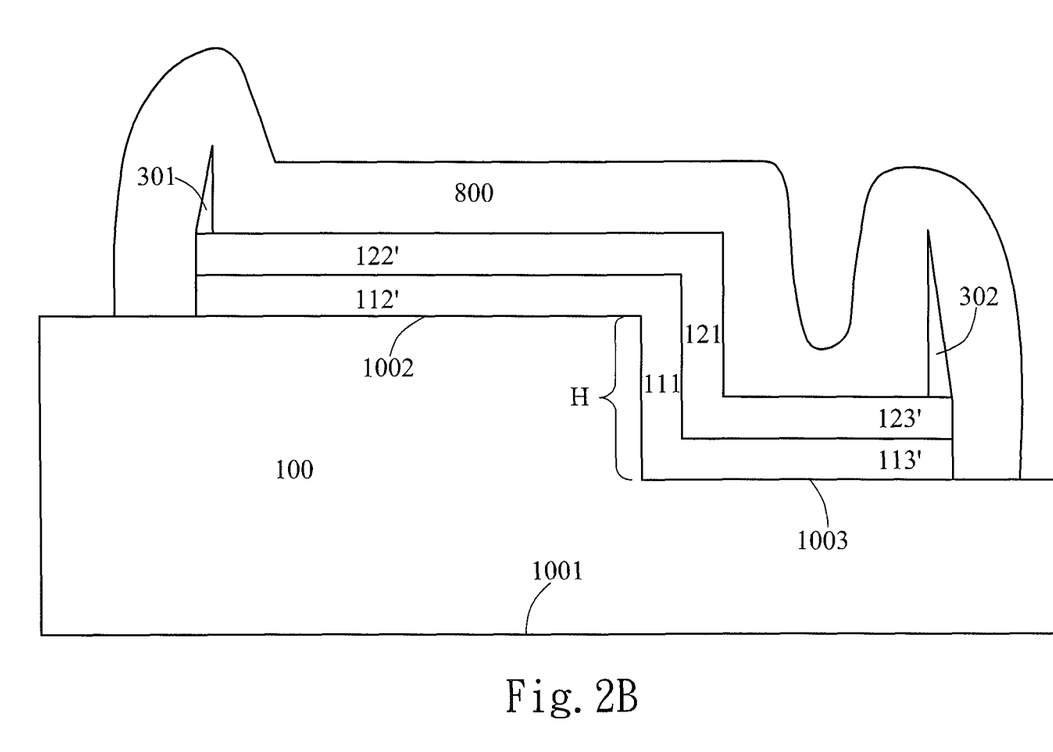

Now please refer to FIGS. 1 and 2A-2B, which illustrate the first embodiment of a method for forming a magnetoresistive structure. A substrate 100 is provided in FIG. 1. The substrate 100 has a back surface 1001 and a front surface having a step portion. The step portion on the front surface comprises a top surface 1002 parallel to the back surface 1001 but facing away from the back surface 1001, a bottom surface 1003 parallel to the back surface 1001 and closer to the back surface 1001 and a step height H joining the top surface 1002 and bottom surface 1003 and being not parallel to the back surface 1001. In other words, the distance between the top surface 1002 and the back surface 1001 is larger than the distance between the bottom surface 1003 and the back surface 1001, thereby providing a step height H between the top surface 1002 and the bottom surface 1003. Although in all the figures step height H is shown to be perpendicular to the back surface 1001, an angle between the step height H and the back surface 1001 could be of any value. Preferably, the included angles between the step height H and the top surface 1002 and between the step height H and the bottom surface 1003 are obtuse angles.

Still refer to FIG. 1. Then, a magnetoresistive layer 110 and a conductive cap layer 120 are blanketly and sequentially formed on the front surface. The magnetoresistive layer 110 has a first horizontal portion 112, a non-horizontal portion 111 and a second horizontal portion 113 corresponding to the top surface 1002, step height H and bottom surface 1003 of the step portion respectively. The magnetoresistive layer 110 whose resistance would vary in response to a change of an external magnetic field may comprise materials selected from ferromagnets, antiferromagnets, non-ferromagnet metals, tunneling oxides, or a combination thereof. The magnetoresistive layer 110 preferably comprises permalloy. The conductive cap layer 120 comprises at least one conductive material selected from pure metals such as tantalum (Ta), titanium (Ti), tungsten (W), ruthenium (Ru), aluminum (Al), alloys, metal nitrides such as tantalum nitride (TaN), titanium nitride (TiN), and metal silicides, such as titanium silicide (TiSi), cobalt silicide (CoSi), nickel silicide (NiSi), or combination thereof.

Still refer to FIG. 1. Then, a patterned photoresist 140 (hereafter would be called photoresist 140 for short) is formed on the conductive cap layer 120. Photoresist 140 is formed by applying a photoresist material, selectively exposing the photoresist material to light using a photo mask with desired patterns and developing the photoresist material. Because photolithography process is well known to a person skilled in the art, its details are omitted here. It is noted that since the conductive cap layer 120 may contain a highly reflective material which disturbs the pattern definition in the photolithography process, it is reasonable to optionally form a bottom anti-reflective coating (BARC), a top anti-reflective coating (TARC) or a dielectric anti-reflective coating (DARC) on the conductive cap layer 120 before applying the photoresist so as to improve performance of the photolithography process. The photoresist could be a positive photoresist, a negative photoresist, a photoresist adapted for various kinds of light sources (such as g-line, I-line or DUV), photo-sensitive resins, etc. Preferably positive photoresist is used in this disclosure.

Then, please turn to FIG. 2A. One or more etching processes are conducted on the conductive cap layer 120 and the magnetoresistive layer 110 using the photoresist 140 as etching mask to form patterned stack structure 700. The patterned stack structure 700 comprises a patterned conductive cap layer 120' and a patterned magnetoresistive layer 110'. The patterned conductive cap layer 120' comprises an etched first horizontal portion 122', un-etched non-horizontal portion 121 and an etched second horizontal portion 123'. The patterned magnetoresistive layer 110' comprises an etched first horizontal portion 112', un-etched non-horizontal portion 111 and an etched second horizontal portion 113'. It is noted that since the byproducts of etching magnetoresistive layer and the conductive cap layer are typically less volatile and would easily re-deposit onto the sidewalls of photoresist 140. They tend to form fence defect 301 and 302 and cause ensuing roughness issues hence electrical performance issues.

Finally please refer to FIG. 2B. After removing the photoresist 140, a passivation layer 800 is formed on the patterned stack structure 700. The passivation layer 800 comprises a material rigid enough and capable of blocking moisture diffusion such as at least one of silicon oxide, silicon nitride, polyimide, quartz, glass and a combination thereof. As described in the embodiment of FIGS. 1 and 2A-2B, the materials to be etched would be re-deposited onto the photoresist sidewalls and form fence defects, so an improved etching process to form a fence-free magnetoresistive structure is needed.

Please refer to FIGS. 1 and 3A-3C, which illustrate a second embodiment of a method for forming a magnetoresistive structure. This embodiment shows the same steps shown in FIG. 1 of the first embodiment, so the descriptions thereof would be omitted. Then, turn to FIG. 3A. At least one etching process is conducted on the conductive cap layer 120 using the photoresist 140 as etching mask to form patterned conductive layer 120'. It is appreciated that the etchant used in this etching process is dedicated to etching the conductive cap layer 120, so under this etchant the etching rate of the conductive cap layer 120 would be much higher than the etching rate of the magnetoresistive layer 110. Nonetheless, more or less some magnetoresistive layer 110 would be consumed at the end of the etching process. Furthermore, the conductive cap layer 120 here acts as a shunt path for electrical current, so its thickness should be as thin as possible, preferably thinner than the thickness of the magnetoresistive layer 110. Since the thickness of the conductive cap layer 120 is much less than that of the magnetoresistive layer 110, there is less chance to form fence defect on the sidewalls of the photoresist 140 after finishing etching the conductive cap layer 120.

Figure 3A:
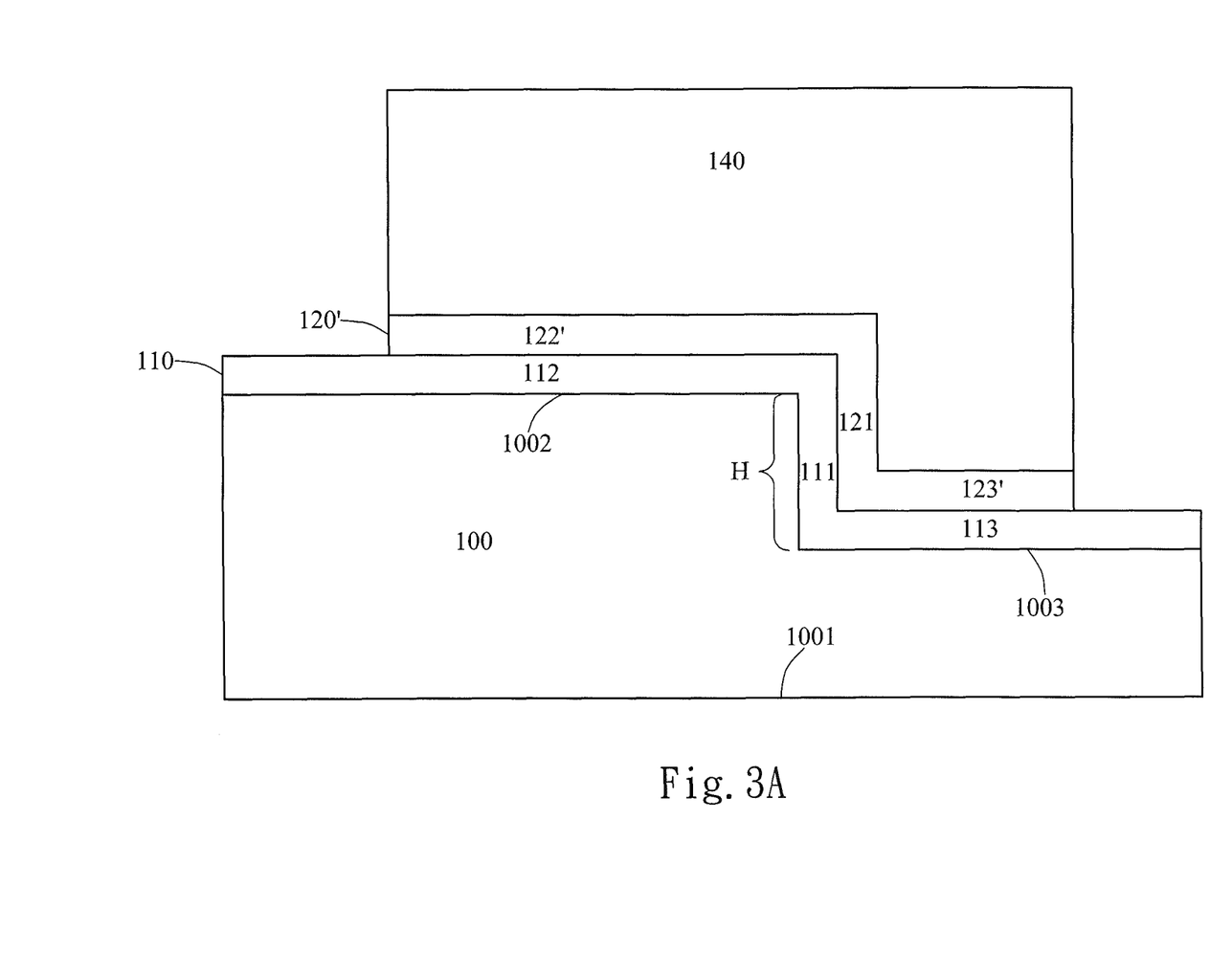
Figure 3B:
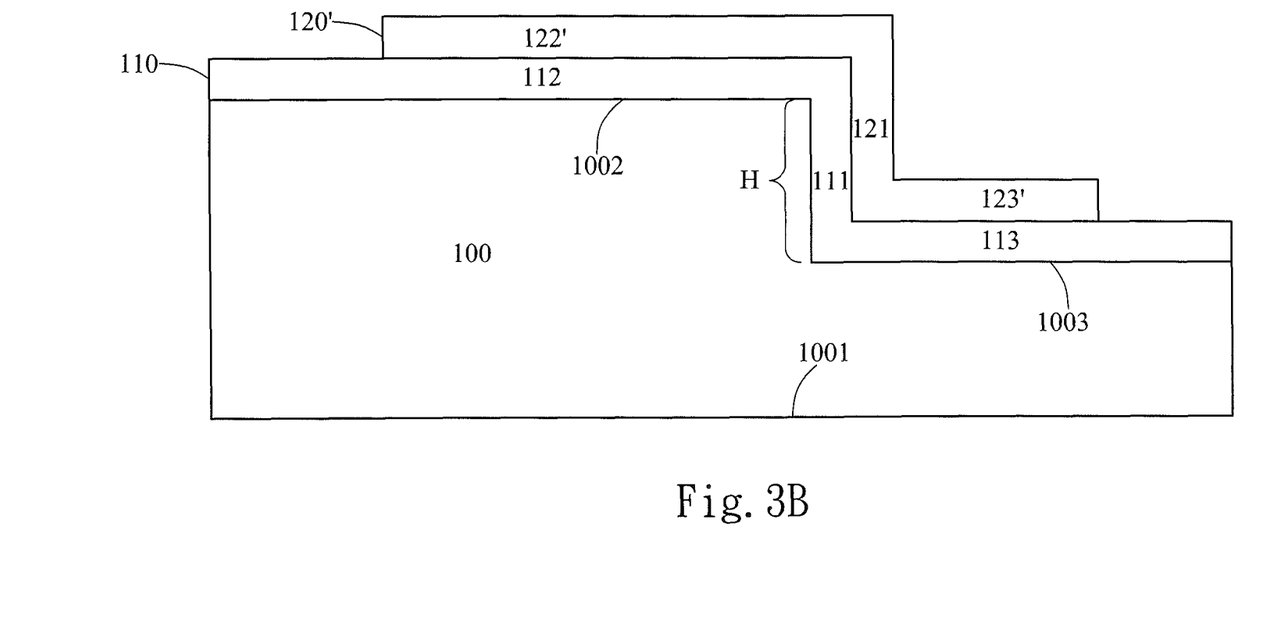

Then refer to FIG. 3B. The photoresist 140 is removed by a dry and/or wet stripping process to expose the patterned conductive cap layer 120'. A dry stripping process may use oxygen plasma, carbon monoxide plasma, etc. and a wet stripping process may use ammonia, sulfuric acid, hydrogen peroxide, hydrofluoric acid, etc.

Figure 3C:
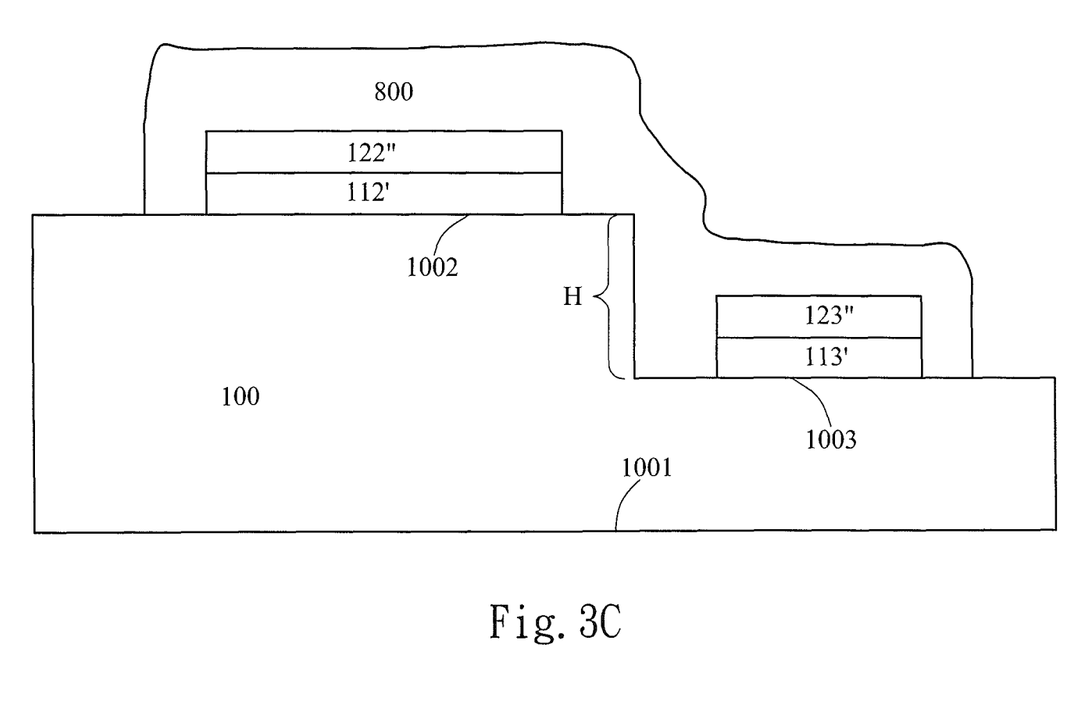

Finally refer to FIG. 3C. at least one etching process is conducted on the magnetoresistive layer 110 using the patterned conductive cap layer 120' as etching mask. It is worth noting that generally the magnetoresistive layer 110 and the conductive cap layer 120 are both formed on the substrate 100 by physical vapor deposition (such as vacuum evaporation or sputtering), such deposition method has less step coverage on the sidewalls than that on the horizontal surfaces, so the non-horizontal conductive cap layer 121 on the step height H is too thin to against the strong etchant attacks during the etching process. As a result, the conductive cap layer 121 and the magnetoresistive layer 111 on the step height H are damaged or even the worst case, completely removed. The conductive cap layer 122' and the magnetoresistive layer 112 around the upper corner of the step height H and the conductive cap layer 123' and the magnetoresistive layer 113 around the bottom corner of the step height H may be also removed, thereby disconnecting the first horizontal portions and the second horizontal portions supposedly joined together by the non-horizontal portions. What's left of the conductive cap layer are the etched first horizontal portion 122" and the etched second horizontal portion 123", while what's left of the magnetoresistive layer 110 are the etched first horizontal portion 112' and the etched second horizontal portion 113'. Even though a passivation 800 is formed thereon, the structure obtained is not the desired structure. To avoid the consequence of FIG. 3, one may thicken the conductive cap layer 120 and render the magnetoresistive layer 111 on the step height H has enough protection, but doing so would increase shunting effect of electrical current and reduce the performance of the magnetoresistive structure. Therefore, an improved method for forming the magnetoresistive structure is needed.

Figure 4A:
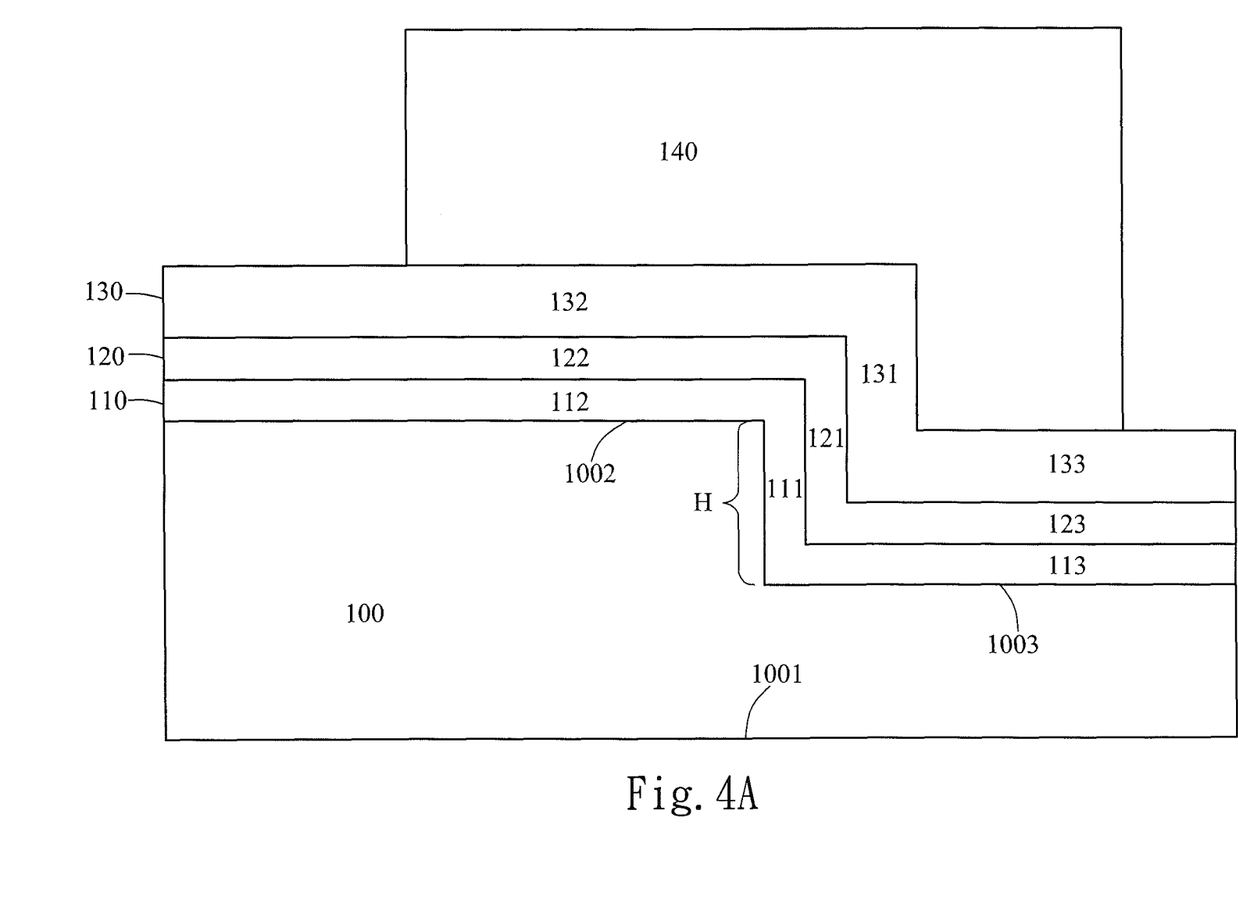
FIGS. 4A-4C illustrates the third embodiment of a method for forming a magnetoresistive structure according to the present invention.
Figure 4B:
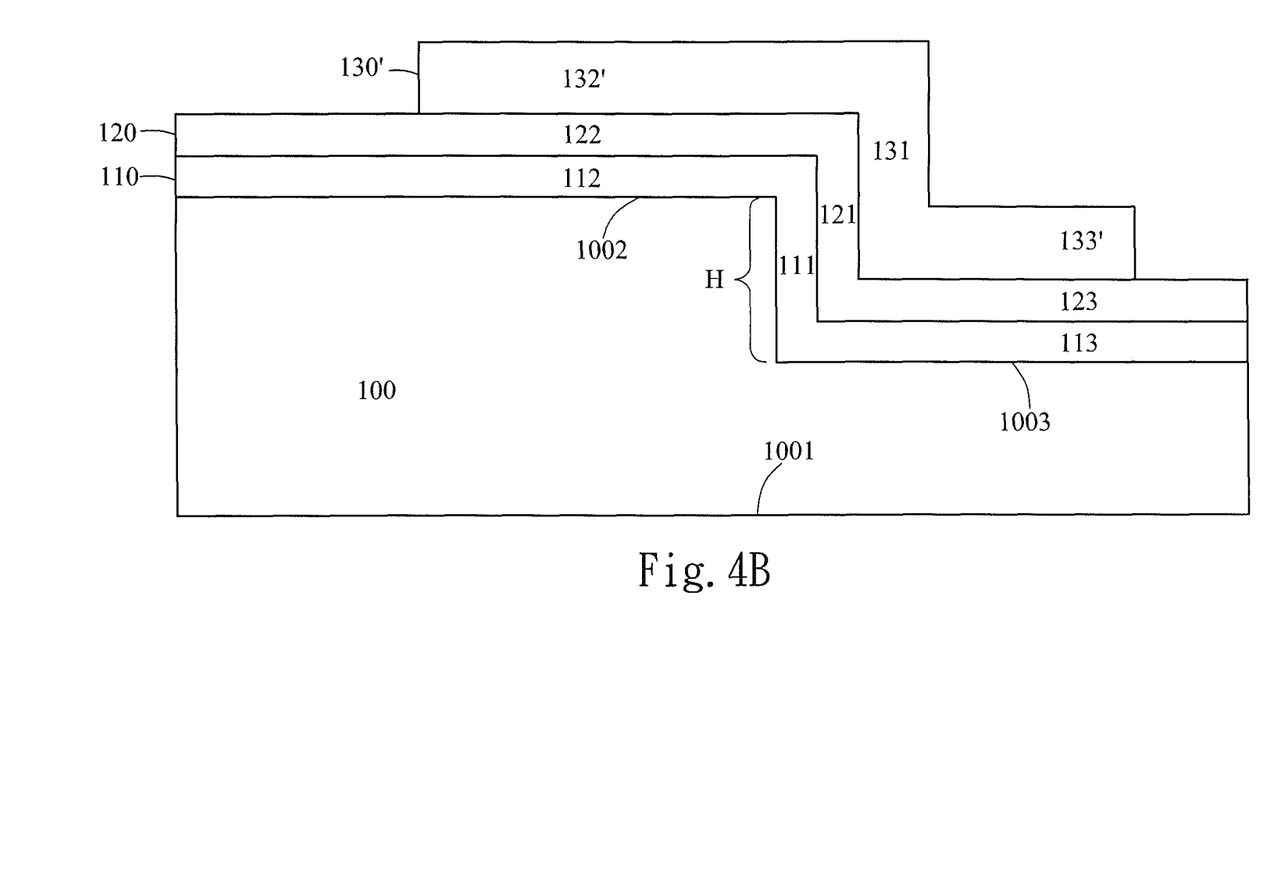
Figure 4C:
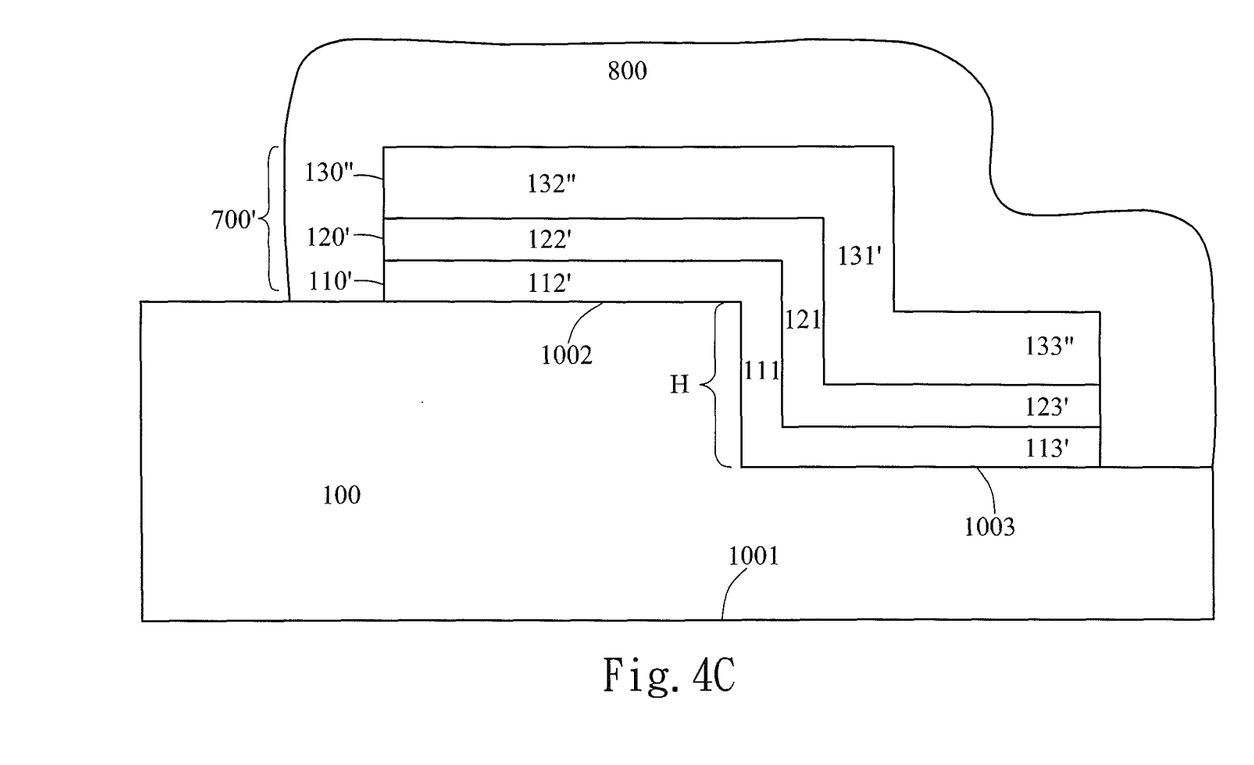

Please refer to FIGS. 4A-4C, which illustrate another embodiment of a method for forming a magnetoresistive structure according to the present invention. FIG. 4A is similar to FIG. 1 except an additional dielectric hard mask layer 130 formed between the conductive cap layer 120 and the photoresist 140. The dielectric hard mask layer 130 comprises a first horizontal portion 132, an non-horizontal portion 131 and a second horizontal portion 133 corresponding to the top surface 1002, the step height H and the bottom surface 1003 respectively. The dielectric hard mask layer may choose at least one of silicon oxide, silicon nitride, silicon oxynitride, silicon carbide, amorphous carbon, and a combination thereof so as to provide high etching selectivity between the dielectric hard mask layer 130 and the underneath conductive cap layer 120 and render the dielectric hard mask layer 130 capable of resisting the etching process for the conductive cap layer 120 and the magnetoresistive layer 110. In general, dielectric hard mask layers are mostly formed by chemical vapor deposition (CVD) processes. Typically CVD processes have better step coverage than physical vapor deposition (PVD) processes, so the dielectric hard mask layer 130 formed by a CVD process is adequate to be a hard mask layer on the sidewall of the step height H. Now the conductive cap layer 120 does not have to serve as etching mask anymore, so the thickness of the conductive cap layer 120 can be significantly reduced, thereby reducing shunt effect of electrical current. On the other hand, the conductive cap layer 120 may serve as a barrier layer for the magnetoresistive layer to protect it from chemical damage during deposition or etching of the dielectric hard mask layer 130.

Then, please refer to FIG. 4B. At least one etching process is conducted to the dielectric hard mask layer 130 using the photoresist 140 as etching mask to form patterned dielectric hard mask layer 130'. The patterned dielectric hard mask layer 130' comprises an etched first horizontal portion 132', a non-horizontal portion 131 and an etched second horizontal portion 133'. Preferably a dry etching process is used to etch the dielectric hard mask layer 130 and the etchants used in the dry etching process may comprise a fluorine-based gas such as carbon tetrafluoride $CF_4$, oxygen $O_2$, sulfur hexafluoride $SF_6$, ammonia $NH_3$, or a combination thereof. It is worth noting that the etchants used in this dry etching process is mainly for etching the dielectric hard mask layer 130, so in this dry etching process the etching rate of the dielectric hard mask layer would be much higher than that of the conductive cap. However, more or less some conductive cap layer 120 would be consumed at the end of the etching process.

Still refer to FIG. 4B. The photoresist 140 is removed by a dry and/or wet stripping process to expose the patterned dielectric hard mask layer 130'. A dry stripping process may use oxygen plasma, carbon monoxide plasma, etc. and a wet stripping process may use ammonia, sulfuric acid, hydrogen peroxide, hydrofluoric acid, etc.

Finally refer to FIG. 4C. At least one etching process is conducted to etch the underneath conductive cap layer 120 and magnetoresistive layer 110 using the patterned dielectric hard mask layer 130' as etching mask to form patterned stack structure 700'. Then a passivation layer 800 is formed thereon. The patterned stack structure 700' comprises the patterned dielectric hard mask layer 130", patterned conductive cap layer 120' and patterned magnetoresistive layer 110'. The patterned dielectric hard mask layer 130" comprises an etched first horizontal portion 132", an etched non-horizontal portion 131' and an etched second horizontal portion 133". The patterned conductive cap layer 120' comprises an etched first horizontal portion 122', the non-horizontal portion 121 and an etched second horizontal portion 123'. The patterned magnetoresistive layer 110' comprises an etched first horizontal portion 112', the non-horizontal portion 111 and an etched second horizontal portion 113'. Compared to FIG. 3C of only using the conductive cap layer 120' as etching mask, the patterned dielectric hard mask layer 130' of FIG. 4C solves the issue of complete removal of the conductive cap layer 121 and magnetoresistive layer 111 on the step height H. It is worth noting that since the conductive cap layer 120 and the magnetoresistive layer 110 may use different materials, it is possible to use two different etching processes to respectively etch these two layers. If a first etching process is used to etch the conductive cap layer 120 and a second etching process is used to etch the magnetoresistive layer 110, then the first etching process could be a reactive ion etching process and the second etching process could be an ion beam etching. Alternatively, the first and second etching processes are both reactive ion etching processes or they are both ion beam etching processes. When they both are reactive ion etching processes or both are ion beam etching processes, they may be conducted in-situly. The term "in-situly" refers to conducting the first and second etching processes in the same process chamber or conducting them in different chambers of the same cluster tool without breaking vacuum. In general, the conductive cap layer 120 is preferably etched by at least one etchant comprising halogen atoms such as a gas mixture of $CF_4$ and Ar or it may be etched by an ion beam etching process using Ar ions. The magnetoresistive layer 110 may be etched by a reactive ion etching process using a gas mixture of CO and $NH_3$ or it may be etched by an ion beam etching process using Ar ions. Whether the same etching process is used or not and no matter reactive ion etching process or ion beam etching process is used, the ultimate goal is to achieve the desired sidewall profile, critical dimension and surface texture.

Although the first horizontal portion, non-horizontal portion and the second horizontal portion are shown in all the figures, it is possible to design the areas protected by the patterned photoresist 140 so the second horizontal portion and/or the first horizontal portion are/is optionally omitted in considerations of device function and layout requirements. In the present invention, although the patterned dielectric hard mask layer 130" remains in the final structure, it is possible to remove it before forming the passivation layer 800. Furthermore, the stack structure of the present invention does not limit to three layers, magnetoresistive layer, conductive cap layer and dielectric hard mask layer. It should be understood more layers can be inserted between, above or below these three layers.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a magnetoresistive structure, comprising:

providing a substrate with a back surface and a front surface having a step portion;

blanketly forming a stacked structure on the front surface of the substrate, wherein the stacked structure has a magnetoresistive layer, a conductive cap layer and a dielectric hard mask layer;

etching the dielectric hard mask layer to form an etched dielectric hard mask layer;

etching the conductive cap layer and the magnetoresistive layer using the etched dielectric hard mask layer as a mask to form an etched stacked structure, wherein the etched stacked structure has an etched magnetoresistive layer in direct contact with the step portion, an etched conductive cap layer and an etched dielectric hard mask layer, wherein each of the etched magnetoresistive layer, the etched conductive cap layer and the etched dielectric hard mask layer has a first horizontal portion, a non-horizontal portion not parallel to the back surface and a second horizontal portion and spans across the step portion; and forming a passivation layer covering all of the etched magnetoresistive layer, the etched conductive cap layer and the etched dielectric hard mask layer.

2. The method of claim 1, further comprising:

forming a patterned photoresist on the stacked structure; and etching the dielectric hard mask layer of the stacked structure using the patterned photoresist as a mask.

3. The method of claim 2, further comprising:

removing the patterned photoresist after etching the dielectric hard mask layer.

4. The method of claim 1, further comprising:

conducting a first etching process to etch the conductive cap layer; and conducting a second etching process to etch the magnetoresistive layer.

5. The method of claim 4, wherein the first etching process is a reactive ion etching process and the second etching process is an ion beam etching process.

6. The method of claim 4, wherein the first etching process and the second etching process both are reactive ion etching processes.

7. The method of claim 4, wherein the first etching process and the second etching process both are ion beam etching processes.

8. The method of claim 4, wherein the first etching process and the second etching process are conducted in-situly.

9. The method of claim 4, wherein the first etching process uses an etchant comprising halogen atoms.

* * * * *